(12) United States Patent
Dubin et al.

(10) Patent No.: US 7,372,165 B2
(45) Date of Patent: May 13, 2008

(54) METHOD FOR MAKING A SEMICONDUCTOR DEVICE HAVING INCREASED CONDUCTIVE MATERIAL RELIABILITY

(75) Inventors: Valery M. Dubin, Portland, OR (US); Ramanan V. Chebiam, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 332 days.

(21) Appl. No.: 11/077,252

(22) Filed: Mar. 9, 2005

(65) Prior Publication Data

US 2005/0161828 A1 Jul. 28, 2005

Related U.S. Application Data

(62) Division of application No. 10/695,249, filed on Oct. 27, 2003.

(51) Int. Cl.
*H01L 29/40* (2006.01)
*H01L 23/48* (2006.01)
*H01L 23/52* (2006.01)

(52) U.S. Cl. .............................. 257/774; 257/E29.111; 257/E29.326

(58) Field of Classification Search ................ 438/629, 438/663, 694, 626; 257/774, E21.591, E21.585, 257/E29.111, E29.326, E29.12
See application file for complete search history.

(56) References Cited

U.S. PATENT DOCUMENTS

| | | | |
|---|---|---|---|
| 6,022,808 A | 2/2000 | Nogam et al. | |
| 6,100,195 A | 8/2000 | Chan et al. | |
| 6,291,082 B1 | 9/2001 | Lopatin | |
| 6,444,567 B1 | 9/2002 | Besser et al. | |
| 6,551,872 B1 | 4/2003 | Cunningham | |
| 2002/0098681 A1 | 7/2002 | Hu et al. | |
| 2002/0175424 A1* | 11/2002 | Kripesh et al. ............. | 257/779 |

FOREIGN PATENT DOCUMENTS

| JP | 11102909 | 4/1999 |
|---|---|---|
| WO | WO 2004/053971 A | 6/2004 |

* cited by examiner

*Primary Examiner*—Walter Lindsay, Jr.
(74) *Attorney, Agent, or Firm*—Blakely, Sokoloff, Taylor & Zafman LLP

(57) ABSTRACT

A method and apparatus for a semiconductor device having a semiconductor device having increased conductive material reliability is described. That method and apparatus comprises forming a conductive path on a substrate. The conductive path made of a first material. A second material is then deposited on the conductive path. Once the second material is deposited on the conductive path, the diffusion of the second material into the conductive path is facilitated. The second material has a predetermined solubility to substantially diffuse to grain boundaries within the first material.

10 Claims, 4 Drawing Sheets

METHOD FOR MAKING A SEMICONDUCTOR DEVICE HAVING INCREASED CONDUCTIVE MATERIAL RELIABILITY

This is a Divisional application of Ser. No. 10/695,249 filed Oct. 27, 2003, which is presently pending.

TECHNICAL FIELD

An embodiment of the invention generally relates to methods for making semiconductor devices, in particular, semiconductor devices having increased conductive material reliability.

BACKGROUND

Integrated circuits (ICs) such as semiconductor devices are moving toward greater integration and performance. For example, in a semiconductor device, the feature size of a circuit element continues to decrease while the operation speed of the semiconductor device continues to increase. One of the concerns associated with the decrease in feature size and increased operation speed is the reliability of the various components. One component of common concern may be the conductive paths between the circuit elements (e.g., the conduction paths commonly referred to as metal lines) because as the feature size decreases, the conduction paths become increasingly small and thin. As the semiconductor device becomes more integrated and operates at higher speeds, the reliability of these very small and thin conduction paths becomes an increasing concern.

BRIEF DESCRIPTION OF THE DRAWINGS

The various embodiments of the invention is illustrated by way of example and not by way of limitation in the figures of the accompanying drawings, in which the like references indicate similar elements and in which.

DETAILED DESCRIPTION

In various embodiments, a method and apparatus for a semiconductor device having increased conductive material reliability is described. In the following description, various embodiments of the invention will be described. However, one skilled in the relevant art will recognize that the various embodiments of the invention may be practiced without one or more of the specific details, or with other methods, materials, components, etc. In other instances, well-known structures, materials, or operations are not shown or described in detail to avoid obscuring aspects of the various embodiments of the invention. Similarly, for purposes of explanation, specific numbers, materials and configurations are set forth in order to provide a thorough understanding of the embodiments of the invention. Nevertheless, various embodiments of the invention may be practiced without the specific details. In other instances, well-known features are omitted or simplified in order not to obscure the various embodiments of the invention. Furthermore, it is understood that the various embodiments shown in the figures are illustrative representations and are not necessarily drawn to scale.

References throughout this specification to "one embodiment" or "an embodiment" means that a particular feature, structure, material, or characteristic. described in connection with the embodiment is included in at least one embodiment of the invention. Thus, the appearances of the phrases "in one embodiment" or "in an embodiment" in various places throughout this specification are not necessarily all referring to the same embodiment or invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation.

Figure 1A:
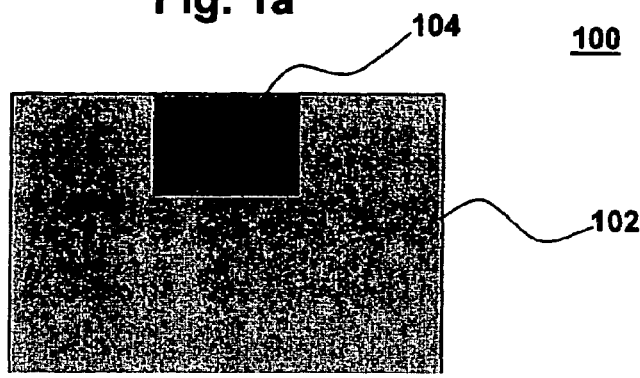
FIGS. 1a-1c illustrate structures that may be formed, when carrying out various embodiments of the invention.
Figure 1B:
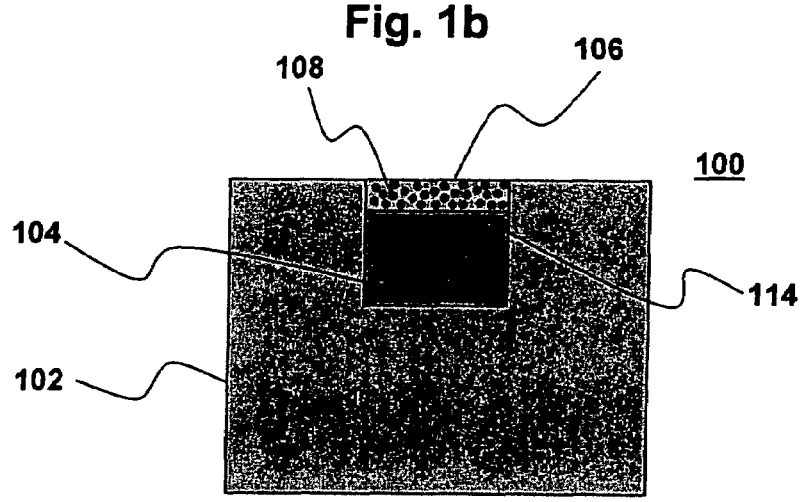
Figure 1C:
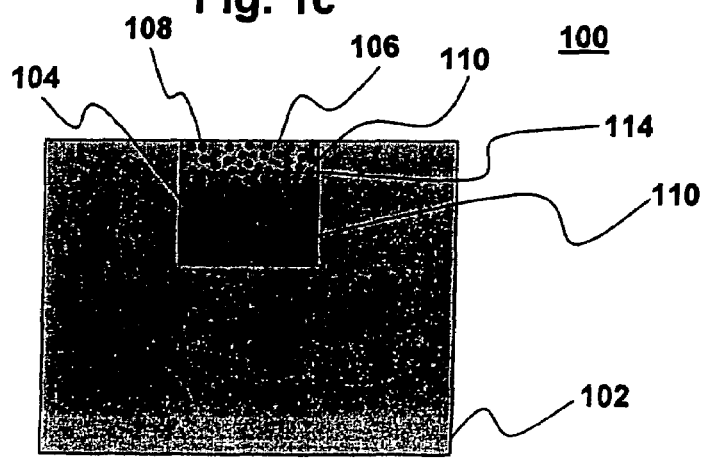

FIGS. 1a-1c illustrate structures that may be formed, when carrying out various embodiments of the invention. As shown in FIG. 1a, an apparatus such as a semiconductor device 100 includes a substrate 102. Formed on the substrate 102 is a conductive path 104 made of a first material. In FIG. 1b, a second material 106 is shown deposited on the conductive path 104. Further, the second material 106 may be represented by particles 108. That is, the particles 108 may represent individual atoms of the second material 106. The conductive path 104 may be made of the first material as previously described, where the first material may be of a conductive material. Accordingly, references to the first material may include any conductive material that make up the conductive path, and hereon out, will be referred to as simply the conductive path.

Additionally, shown in FIG. 1b-1c is an interface 114 disposed between the conductive path 104 and the second material 106. The interface 114 may be the physical interface between the conductive path 104 and the second material 106. In one embodiment, the interface 114 may include a marker type layer such as, but not limited to, an etch stop layer. One example of a marker type layer may be a thin layer of silicon nitride ($Si_3N_4$) deposited on the conductive path.

In FIG. 1c, the particles 108 of the second material 106 is shown having diffused into the conductive path 104 resulting in diffused particles 110. The diffused particles 110 may represent diffusion of the second material 106 into the conductive path 104. In accordance with various embodiments of the invention, the second material 106 may have a predetermined solubility to substantially diffuse to the interface 114 between the second material 106 and the conductive path 104. Additionally, the second material 106 may have a predetermined solubility to substantially diffuse to the grain boundaries (not shown) within the conductive path 104. That is, the second material 106 may diffuse to the interface 114, the grain boundaries, or any combination thereof in the conductive path 104. Accordingly, in the various embodiments illustrated in FIG. 1c, the diffused particles 110, having substantially diffused into the conductive path 104, may represent diffused particles 110 that reside in the interface 114 and in the grain boundaries of the conductive path 104. As will be described in further detail below, the diffusion of the second material 106 into the conductive path 104 may be facilitated by various heat treating methods such as, but not limited to, annealing.

As a result, reliability of a conductive path is significantly increased, in accordance with various embodiments of the invention.

Continuing to refer to FIGS. 1a-1c, in various embodiments, the substrate 102 may comprise of an insulating material layer such as, but not limited to, an interlayer dielectric (ILD) layer. Additionally, as previously alluded to, the conductive path 104 may be made of any conductive material such as, but not limited to, metal material. In various embodiments, the conductive path 104 may be copper. Accordingly, the conductive path 104 may be formed by a damascene type process.

In various embodiments, depositing the second material 106 may comprise a plating process (i.e., plating the second material 106 onto the conductive path 104). The plating process may involve plating processes such as, but not limited to, electroplating, electroless, or immersion plating the second material 106 onto the conductive path 104.

In various embodiments, the second material 106 may be of a noble type metal, which may include noble type metals such as, but not limited to, silver, gold, palladium, ruthenium, rhodium, osmium, iridium, and platinum or any combination thereof. Accordingly, the second material 106 may have a solubility corresponding to the properties associated with that of noble metals. That is, the second material 106 may have a solubility that is relatively low as compared to the conductive path 104. Because the solubility of the second material 106 may be relatively low, the particles 108 of the second material 106 may substantially diffuse to the interface 114 and/or to the grain boundaries (not shown) of the conductive path 104. For example, the conductive path 104 may be copper, and the second material 106 may be silver.

As previously alluded to, the diffusion of the particles 108 from the second material 106 to the conductive path 104 may be facilitated by various heat treating methods such as, but not limited to, annealing the conductive path 104 having the second material 106. The annealing process may be of a predetermined temperature range to facilitate the diffusion of the particles 110 to substantially the interface 114 and/or the grain boundaries within the conductive path 104 to a predetermined depth. For example, one such temperature range may be, but not limited to, a range of up to less than 400° C.

In the previously described example of the conductive path 104 being of a copper material, and the second material 108 being of a silver material, the heat treatment to facilitate diffusion may be 300° C. The length of time of the heat treatment may be based at least in part on the depth of the conductive path 104 (i.e., the thickness of the conductive path). For example, the thicker the conductive path 104, the longer the heat treatment process. Accordingly, the resulting diffused particles 110 may represent individual atoms of the second material 106 (silver) being in close proximity of the interface 114 and the grain boundaries within the conductive path 104 (copper).

In the various embodiments illustrated in FIGS. 1a-1c, the second material may be deposited subsequent to a planarization process such as, but not limited to, a chemical mechanical polishing (CMP) process. That is, the second material 106 may be deposited subsequent to a CMP of the substrate 102 having the conductive path 104.

FIGS. 2a-2d illustrate structures that may be formed, in accordance with various embodiments of the invention. Similar to the semiconductor device 100 illustrated in FIGS. 1a-1c, shown in FIG. 2a, the semiconductor device 200 includes a substrate 202 and a conductive path 206 formed on the substrate 202. However, in FIG. 2a, the substrate 202 includes a barrier layer 204 formed between the conductive path 206 and the substrate 202. The barrier layer 204 may be utilized to aid in preventing the conductive path 206 from diffusing into the substrate 202. Further, between the conductive path 206 and the barrier layer 204, the semiconductor device 200 includes an interface 214. In various embodiments illustrated in FIGS. 2a-2c, unlike the interface previously described in FIGS. 1a-1c, the interface 214 may represent the physical interface between the conductive path 206 and the barrier layer 204 without having a layer of material disposed between the conductive path 206 and the barrier layer 204. However, it is contemplated within the scope of the various embodiments that the interface 214 may include a layer of material.

Figure 2A:
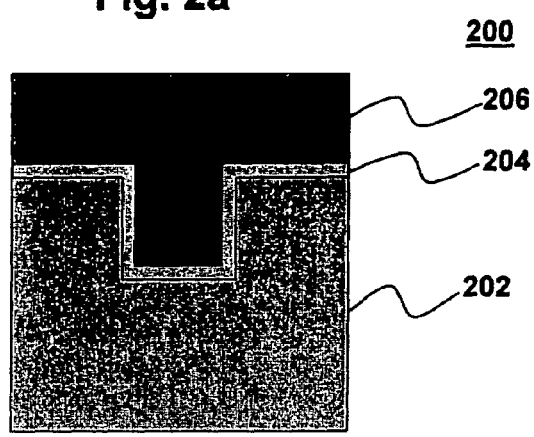
FIGS. 2a-2d illustrate structures that may be formed, in accordance with various embodiments of the invention.

Additionally, in FIG. 2a, the conductive path 206 is shown before a planarization process such as, but not limited to, CMP of the substrate 202. Accordingly, the conductive path 206 is shown extending above the substrate 202.

Figure 2B:
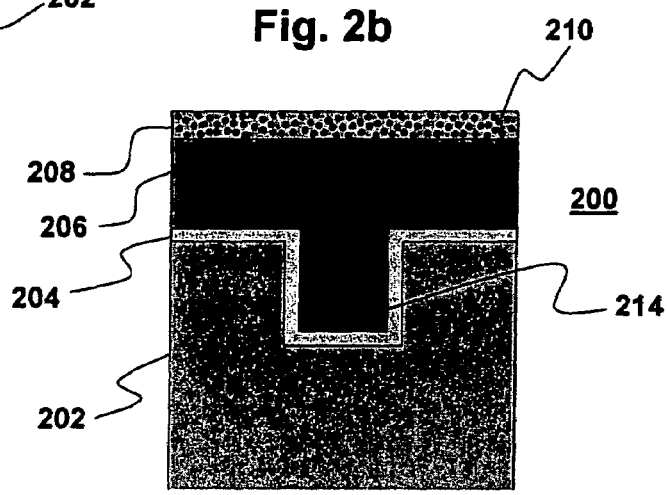
Figure 2C:
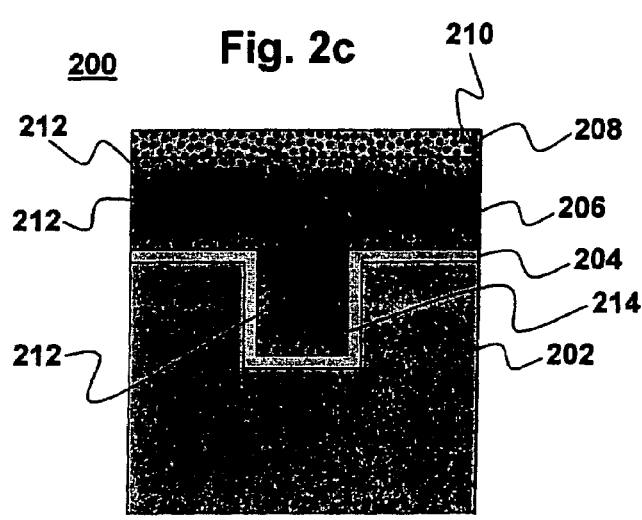

Referring to FIG. 2b, a second material 208 is shown deposited on the conductive path 206. As previously described, the second material 208 may be represented by particles 210, where each of the particles 210 may represent an atom of the second material 208. Turning now to FIG. 2c, the particles 210 of the second material 208 is shown having diffused into the conductive path 206 resulting in diffused particles 212.

As previously described with respect to FIGS. 1a-1c, in accordance with various embodiments of the invention, the second material 208 may have a predetermined solubility to substantially diffuse to the interface 114 between the conductive path 206 and the barrier layer 204. Here again, the second material 208 may have a predetermined solubility to substantially diffuse to the grain boundaries (not shown) within the conductive path 206. That is, the second material 210 may diffuse to the interface 214, the grain boundaries, or any combination thereof in the conductive path 206. Accordingly, in FIG. 2c, the diffused particles 212, having substantially diffused into the conductive path 206, may represent diffused particles 212 that reside in interface 214 and the grain boundaries of the conductive path 206.

Figure 2D:
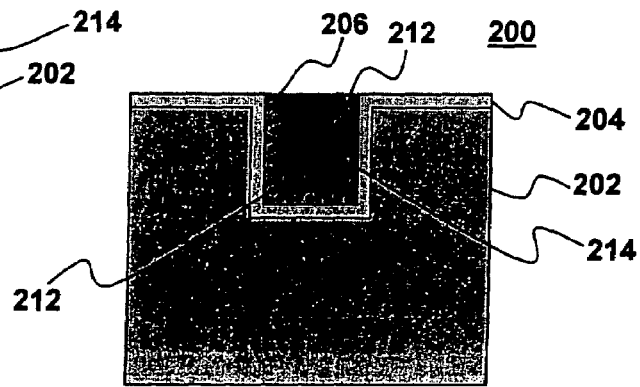

Once the diffusion of the second material 208 (i.e., the particles 210) into the conductive path 206 has been facilitated, a planarization process may be applied as illustrated in FIG. 2d. As shown in FIG. 2d, in various embodiments, a planarization process such as, but not limited to, CMP may be been applied to remove excess material of the conductive path 206.

Referring to FIGS. 2a-2d, in various embodiments, the substrate 202 may comprise of an insulating material such as, but not limited to, an ILD. The conductive path 206 may be made of a metal material such as, but not limited to, copper. Accordingly, the conductive path 206 may be formed by a damascene type process.

In various embodiments, depositing the second material 208 may comprise a plating process (i.e., plating the second material 208 onto the conductive path 206). As previously described, the plating process may involve plating processes such as, but not limited to, electroplating, electroless plating, immersion plating, or any combination thereof.

Here again, in various embodiments, the second material 208 may be of a noble type metal, which may include noble type metals such as, but not limited to, silver, gold, palladium, ruthenium, rhodium, osmium, iridium, and platinum or any combination thereof. Accordingly, the second material 208 may have a solubility that is relatively low as compared to the conductive path 206. Because the solubility of the second material 208 may be relatively low, the particles 210 of the second material 208 may substantially diffuse to the interface 214 and/or to the grain boundaries (not shown) of the conductive path 206 as previously described. For example, the conductive path 206 may be copper, and the second material 208 may be silver.

Figure 3:
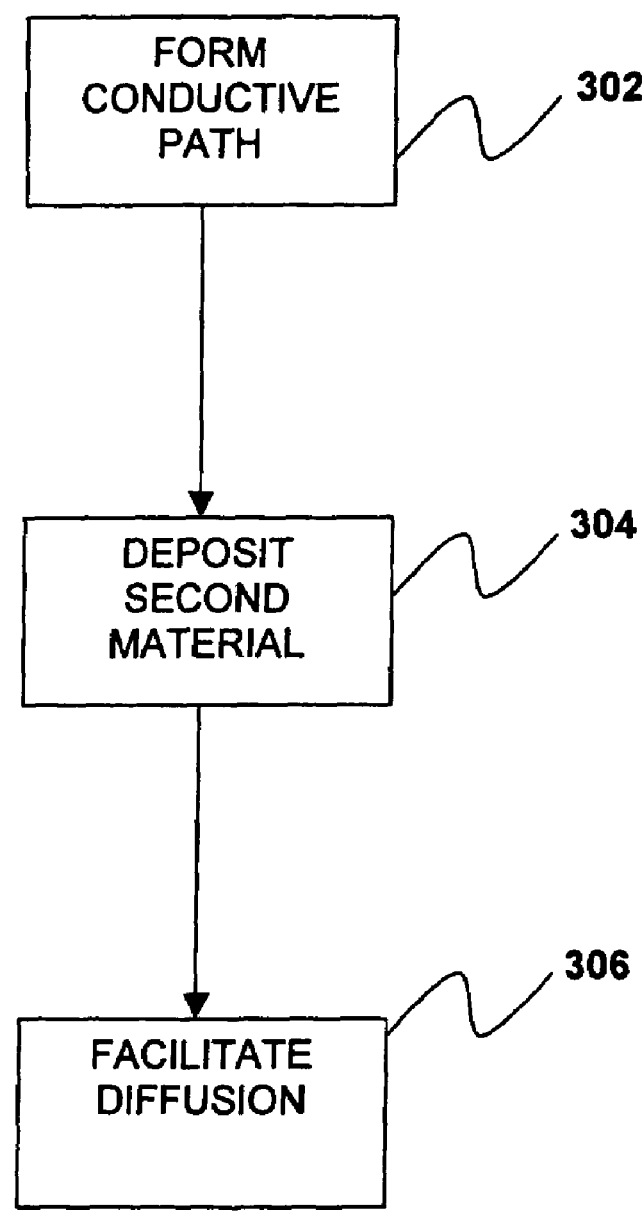
FIG. 3 illustrates an operational flow of a process for forming a semiconductor device, in accordance with an embodiment of the invention.

FIG. 3 illustrates an operational flow of a process for forming a semiconductor device, in accordance with an embodiment of the invention. The embodiment of the operational flow may be applicable to FIGS. 1a-1c and 2a-2d. At block 302, a conductive path is formed on a substrate. The substrate may or may not have a barrier layer, upon which, the conductive path may be formed, as previously described. On the conductive path, a second material is deposited, at block 304. Once the second material is deposited, the diffusion of the second material into the conductive path is facilitated, at block 306.

The above operational flow may also include planarization methods as previously described. The planarization methods may be based at least in part on whether the second material is deposited before or after the planarization process.

Figure 4:
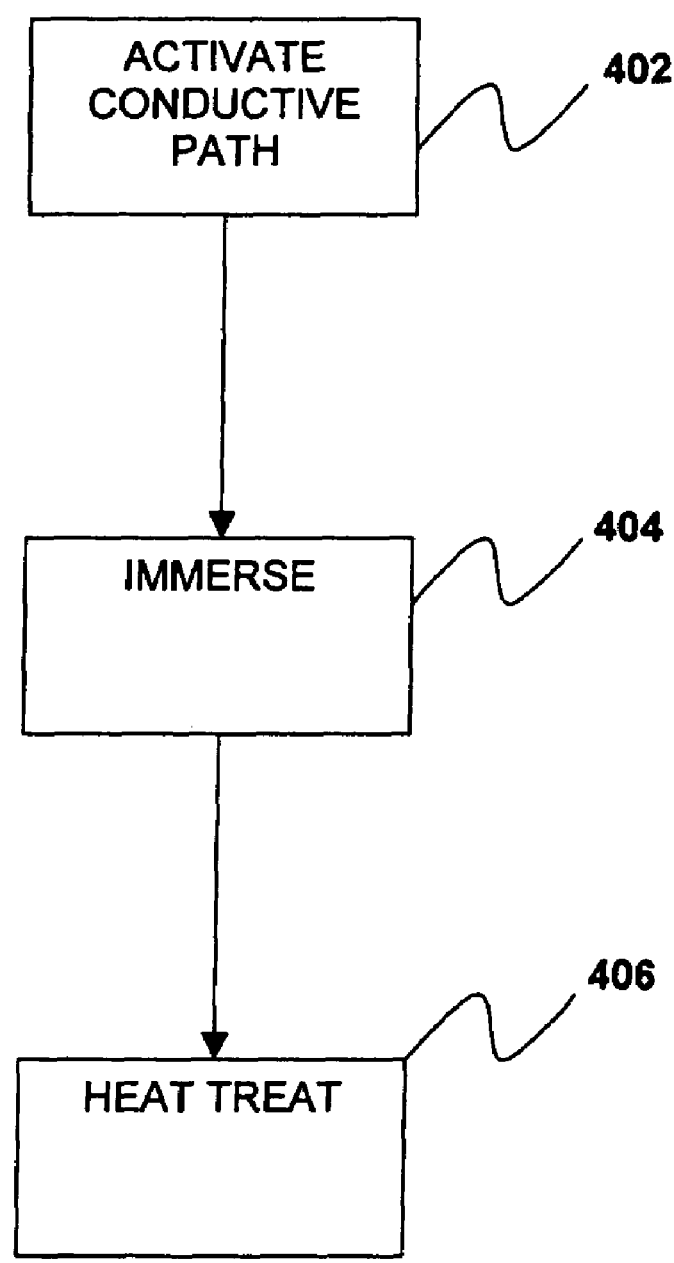
FIG. 4 illustrates in further detail an operational flow, in accordance with an embodiment of the invention.

FIG. 4 illustrates in further detail an operational flow, in accordance with an embodiment of the invention. The operational flow of FIG. 4 may be applicable to the deposition of the second material and the facilitation of diffusion of the second material 304 & 306 (shown in FIG. 3). At block 402, any insulating layer is removed from the conductive path to activate the material of the conductive path. The insulating layer may be an oxide of the material of the conductive path (e.g., copper oxide corresponding to the conductive material being copper). The insulating layer may be removed by an etching process such as, but not limited to, etching the conductive path in a medium having a mildly acidic or basic solution.

Once the insulating layer is removed, the conductive path may be immersed in a solution having at least the second material, at block 404. The solution may be an aqueous solution having the second material and various other materials. Immersing the solution in an aqueous solution may facilitate deposition of the second material onto the conductive path.

For example, in one embodiment, where the material of the conductive path may be copper and the second material may be silver, the aqueous solution may have the following materials: (a) approximately 0.01-0.1 M of a silver salt solution, (b) approximately 0.1-1 M of ammonium sulfate, (c) application dependent amount of ammonium hydroxide to adjust the pH of the solution, and (d) approximately 0-1 M of ammonium thiosulfate. Additionally, various amounts of complexing agents may be utilized such as, but not limited to, glycine, ethylenediamine tetraacetic acid (EDTA), ethylenediamine (EDA), and citric acid.

In another example, in one embodiment where the material of the conductive path may be copper and the second material may be palladium, the aqueous solution may have the following materials: (a) approximately 0.2 g/l of palladium chloride dissolved in approximately 25 ml of concentrated acid such as, but not limited to, hydrochloric acid, (b) approximately 500 ml of pure acetic acid for every liter of solution, and (c) approximately 250 ml of 50:1 diluted hydrochloric acid for every liter of solution.

Once the second material is deposited on the conductive path, the conductive path having the second material may be heat treated to facilitate diffusion of the second material into the conductive path, at block 406. As previously described, the second material may have a predetermined solubility as compared to the material of the conductive path to substantially diffuse to an interface and/or to grain boundaries within the first material.

As previously alluded to, the above methods of depositing the second material have been described associated with chemical immersion techniques. However, in various embodiments, the second material may be deposited by various plating methods such as, but not limited to, electroless plating or electroplating methods.

Forming the conductive path may be performed utilizing a variety of known methods such as, but not limited to, chemical vapor deposition (CVD), physical vapor deposition (PVD), and various electrochemical methods. The ILD may be any type of dielectric such as, but not limited to, a low-k dielectric. The barrier layer may be of any type of diffusion barrier layer such as, but not limited to, a barrier layer made of tantalum nitride (TaN) to help facilitate prevention of the conductive path material from penetrating into the substrate.

In the above description, as previously described, the second material may have a low solubility in the conductive path. In various embodiments, the first material may be made of a copper material, while the second material may be made of a noble metal material. Accordingly, the second material may substantially diffuse to an interface and/or to grain boundaries of the conductive path due to its low solubility in copper. For example, in the case of diffusion into the grain boundaries, the grain boundaries may be areas of lattice misfits, and the diffusion of the second material (i.e., the second material atom) into the grain boundaries may facilitate reduction of strain energy within the grain boundaries.

Having the second material within the grain boundaries of the conductive path facilitates significant increase in reliability of the conductive path.

Having described and illustrated the principles of the invention with reference to illustrated embodiments, it will be recognized that the illustrated embodiments can be modified in arrangement and detail without departing from such principles. Additionally, although the foregoing discussion has focused on particular embodiments, other configurations are contemplated. For example, in order to not obscure the various embodiments of the invention, in FIGS. 1a-2d, the semiconductor devices 100 & 200 are shown having a small number of components and/or features. Accordingly, the semiconductor devices 100 & 200 may have a variety of components and/or features. Additionally, the semiconductor devices 100 & 200 represents a wide variety of semiconductor devices such as, but not limited to, devices made by various metal oxide on silicon (MOS) devices, e.g., insulated gate field effect transistor (IGFET).

Thus, it can be seen from the above descriptions, a novel method and apparatus for a semiconductor device having increased conductive material reliability, has been described.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. Thus, the description is to be regarded as illustrative instead of restrictive on the invention.

Consequently, in view of the wide variety of permutations to the embodiments described herein, this detailed description is intended to be illustrative only, and should not be taken as limiting the scope of the invention. What is claimed as the invention, therefore, is all such modifications as may come within the scope and spirit of the following claims and equivalents thereto.

What is claimed is:

1. A semiconductor device comprising:
   a conductive path formed on a substrate, the conductive path made of a first material; and
   a second material deposited on the conductive path, the second material having a predetermined solubility to diffuse to grain boundaries within the first material to increase reliability of the conductive path; and
   an interface layer disposed between the conductive path and the second material, the interface layer having a thickness sufficient to diffuse the second material in the conductive path.

2. The semiconductor device of claim 1, wherein the first material comprises a metal.

3. The semiconductor device of claim 2, wherein the metal is copper.

4. The semiconductor device of claim 3, wherein the conductive path comprises a conductive path formed by a damascene process.

5. The semiconductor device of claim 1, further comprising a barrier layer between the substrate and the conductive path.

6. The semiconductor device of claim 1, wherein the substrate comprises an interlayer dielectric layer (ILD).

7. The semiconductor device of claim 1, wherein the second material comprises a noble metal.

8. The semiconductor device of claim 7, wherein the second material further comprises at least one of silver, gold, palladium, ruthenium, rhodium, osmium, iridium, and platinum.

9. The semiconductor device of claim 1, wherein the interface layer includes a dielectric material.

10. The semiconductor device of claim 1, wherein the dielectric material includes silicon nitride.

* * * * *